United States Patent [19]
Jelinger

[11] Patent Number: 6,166,916
[45] Date of Patent: Dec. 26, 2000

[54] ADJUSTABLE CIRCUIT BOARD SUPPORT FRAME

[75] Inventor: Conrad A. H. Jelinger, Toledo, Ohio

[73] Assignee: Unitrend, Inc., Toledo, Ohio

[21] Appl. No.: 08/969,877

[22] Filed: Nov. 14, 1997

[51] Int. Cl.$^7$ .............................. H05K 7/14; B65D 85/86
[52] U.S. Cl. ...................... 361/756; 361/759; 361/801; 361/802; 211/41.17; 206/706; 312/265.1
[58] Field of Search .................................. 361/752, 753, 361/755, 756, 758, 759, 796, 801, 802, 804, 807, 808, 810, 813, 825; 206/706; 211/41.17; 312/334.28, 205, 265.1, 265.2

[56] References Cited

U.S. PATENT DOCUMENTS

| | | | |
|---|---|---|---|
| 4,716,497 | 12/1987 | Craker | 361/740 |
| 5,216,578 | 6/1993 | Zenitani et al. | 361/801 X |
| 5,383,793 | 1/1995 | Hsu et al. | 361/801 X |
| 5,623,396 | 4/1997 | Blackwell | 361/801 |
| 5,626,406 | 5/1997 | Schmid | 312/334.28 |
| 5,642,263 | 6/1997 | Lauruhn | 361/801 |
| 5,661,640 | 8/1997 | Mills et al. | 361/801 |
| 6,017,104 | 1/2000 | Foschino | 312/205 |

*Primary Examiner*—Jayprakash N. Gandhi
*Attorney, Agent, or Firm*—MacMillan, Sobanski & Todd, LLC

[57] ABSTRACT

An adjustable circuit board support frame utilizes an adjustable frame assembly for receiving various size circuit boards having the desired interface connectors and logic circuits thereon so as to allow for necessary repair, expansion, or upgrade of the computer system. The present invention provides for the removability and replacement of any size circuit board within the computer housing at any time during manufacturing or in the field. A base computer system may be easily upgraded when more features are desired by interchanging the circuit board within the system and adjusting the frame assembly to the desired position.

13 Claims, 2 Drawing Sheets

ADJUSTABLE CIRCUIT BOARD SUPPORT FRAME

FIELD OF THE INVENTION

The present invention relates generally to an adjustable circuit board support frame and, more particularly, to an improved adjustable circuit board support frame assembly which is mounted in the chassis of a computer. The circuit board frame assembly includes a pair of adjustable bottom support strips and a pair of side gripping channels so as to permit insertion and removal of circuit boards of various sizes.

BACKGROUND OF THE INVENTION

Fastening holes in circuit boards are susceptible to misalignment when being installed in the typical personal computer chassis. Misalignment often means that the computer chassis has to be replaced or re-machined for proper alignment.

Accordingly, one aspect of the present invention is to provide an adjustable circuit board support frame without the need for alignment of fasteners. Another aspect of the present invention is to provide a circuit board support frame that may be adjusted to accommodate any size circuit board for ease of replacement of the circuit board and upgrade of the computer.

SUMMARY OF THE INVENTION

The present invention relates to an adjustable circuit board frame assembly having a pair of C-shaped end rails on opposite sides of the frame assembly and a pair of gripping channels slidably mounted on each of the end rails for adjustment of the relative position of the gripping channels along the length of the end rails. The two end rails are connected to the computer chassis by a pair of locator pins extending from the bottom surface of the end rails. The locator pins mate with apertures on the base of the computer chassis so that the end rails remain secure to the chassis when the circuit board support frame is inserted in the computer.

Spanning the distance between the end rails is a pair of bottom support strips slidably supported on each of the end rails for adjustment of the relative position of the support strips along the end rails. The bottom support strips include a plurality of spaced apart support pegs for supporting the circuit board in position. The support pegs have the additional advantage of allowing circulation of air along the bottom of the circuit board for cooling.

A suitable latch means is also provided which interlocks the gripping channels along the end rails in the desired position. In the preferred embodiment, the latch means are locking tabs having a pin with an oval-shaped cross sectional area so that when rotated within the end rails, the locking tab is held in place by frictional forces between the pin and the surface area of the end rail.

In accordance with the present invention, a circuit board, such as a motherboard, is supported on the end rails and on the pegs of the bottom support strips. The gripping channels are then slidably adjusted against the edge of the motherboard and then fixed in position by the locking tabs. When a different sized motherboard is needed, the locking tabs are removed, thus permitting the gripping channels to be slidably adjusted along the end rails to the new desired position. It is thus possible to provide a wide degree of adjustment of the frame assembly so as to accept any size motherboard.

Other features of the circuit board Frame assembly of the present invention permit ease of assembly and operation. The gripping channel and bottom support strips are provided with guide elements which engage within t he longitudinal slots formed by the end rails. The frame assembly mechanism thus operates smoothly and efficiently.

Other advantages and meritorious features of the present invention will be more fully understood from the following description of the preferred embodiment, the appended claims and the drawings, a brief description of which follows.

BRIEF DESCRIPTION OF THE DRAWINGS

The present invention is described with reference to the drawings in which.

DESCRIPTION OF THE PREFERRED EMBODIMENTS

The present invention will now be more particularly described with reference to the drawings.

Figure 1:
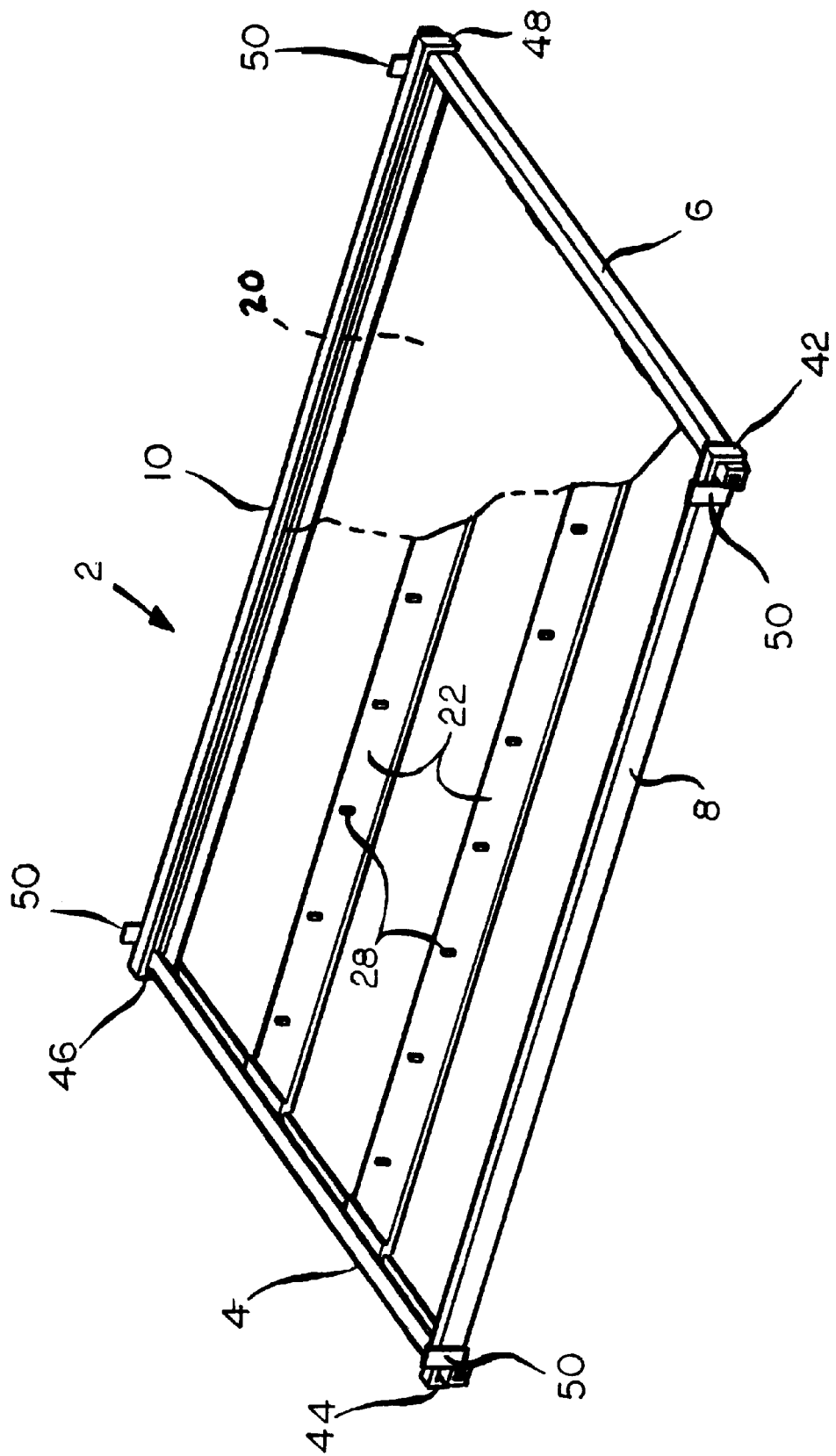
FIG. 1 shows a perspective view of the adjustable circuit board frame assembly according to the present invention.
Figure 2:
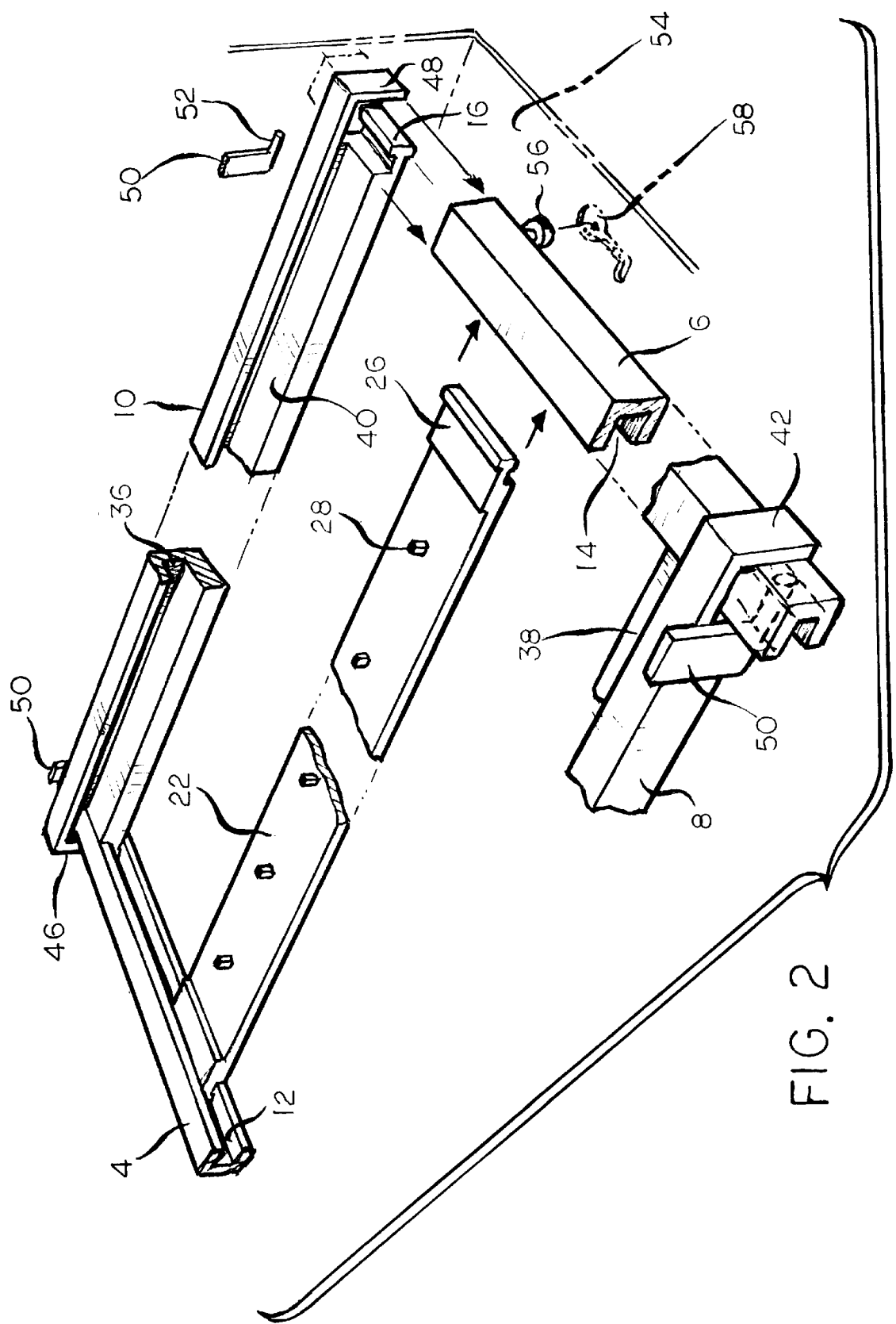
FIG. 2 shows a partially exploded perspective view of the adjustable circuit board frame assembly shown in FIG. 1.

Referring first to FIG. 1, an adjustable circuit board support assembly 2 according to the invention includes two end rails 4 and 6 at opposite sides of the i.e. assembly 2 which are, in turn, mounted to the base of the computer chassis (as seen in FIG. 2) as described in more detail below. The end rails 4 and 6 are generally C-shaped and form slots 12 and 14 to which further elements of the assembly 2 are slidably engaged.

As best seen in FIG. 2, further elements of the support assembly 2 include a pair of gripping channels 8 and 10. The gripping channels 8 and 10 form longitudinal slots 36 and (not shown) respectively, and also include lower portions 38 and 40, and guide rails 42, 44, 46, and 48. Each end of the gripping channels 8 and 10 include guide elements 16 to engage with the slots 12 and 14 of end rails 4 and 6. Guide elements 16 are slidably engaged within the slots 12 and 14 which permits adjustment of the gripping channels 8 and 10 along the longitudinal axis of the end rails 4 and 6 as required to hold the circuit board 20 in position. Guide rails 42, 44, 46, and 48 further assist in retaining the guide elements 16 within the slots 12 and 14 of the end rails 4 and 6.

As seen in FIGS. 1–2, the present invention also includes at least one bottom support strip 22 for preventing the center of the circuit board 20 from bending. More than one support strip may be used based on the size of the circuit board utilized. Each end of the bottom support strip 22 includes guide elements 26 to engage the slots 12 and 14 of end rails 4 and 6. The guide elements 26 are slidably engaged within the slots 12 and 14 which permits adjustment of the bottom support strips 22 and 24 along the longitudinal axis of the end rails 4 and 6. The upper surface of the support strip 22 also includes a plurality of spaced apart pegs 28 upon which the circuit board 20 is placed. Pegs 28 have the additional advantage of allowing circulation of air along the bottom of the circuit board 20 for cooling.

A suitable latch means is also provided which interlocks the gripping channels 8 and 10 along the end rails 4 and 6 in the desired position. In the preferred embodiment, the latch means are locking tabs 50 having a pin 52 with an oval-shaped cross sectional area. The locking tabs 50 are placed inside the slots 12 and 14 and rotated into locking position against the upper and lower surface area of slots 12 and 14 formed within the end rails 4 and 6.

The circuit board support frame 2 is interconnected with the base of the computer chassis 54 through locator pins 56. The locator pins 56 are received through aperture 58 in the computer chassis 54 and locked in place.

In accordance with the present invention, a circuit board, such as a motherboard shown in phantom in FIG. 1, is supported on the upper surface of the end rails 4 and 6, the pegs 28 of the bottom support strip 22, And on the lower portions 38, 40 of the gripping channels 8 and 10. Once the motherboard is in place, the gripping channels 8 and 10 are slidably adjusted along the longitudinal slots 12 and 14 against the edge of the motherboard and then fixed in position by the locking tabs 50. The edges of the motherboard are supported within the longitudinal slots 36 and(not shown). When a different sized motherboard is needed, the locking tabs 50 are removed permitting the gripping channels 8 and 10 to be slidably adjusted along the end rails 4 and 6 to the new desired position. It is thus possible to provide a wide degree of adjustment of the frame assembly 2 so as to accept any size motherboard.

While the invention has been described in its preferred embodiments, it is to be understood that i:he words which have been used are words of description rather than limitation and that changes within the purview of the appended claims may be made without departing from the true scope and spirit of the invention in its broader aspects.

What is claimed is:

1. An adjustable board support frame comprising:
   a pair of end rails, each end rail having a slot extending along a longitudinal axis thereof;
   a pair of gripping channels oriented in a substantially perpendicular direction with respect to said pair of end rails, each end of said pair of gripping channels including a guide element for slidably engaging the slot of each end rail to permit adjustment of said pair of gripping channels along the longitudinal axis of said end rails for engaging a board at a selected position along said end rails; and
   a locking tab capable of being received within said slot for locking said gripping channels at the selected position along the longitudinal axis of said end rails.

2. A board support frame as defined in claim 1 further comprising:
   a bottom support strip between said gripping channels slidably supported on each of said end rails.

3. A board support frame as defined in claim 2 wherein said bottom support strip includes a guide element capable of being received within said slot for selecting a position of said bottom support strip along said end rails.

4. A board support frame as defined in claim 1 further comprising:
   a pair of locator pins on said end rail for interlocking said board support frame to a base of a computer chassis.

5. A board support frame as defined in claim 1 wherein said gripping channels include a slot for slidably supporting the board.

6. A board support frame as defined in claim 1, wherein said locking tab further includes an oval-shaped pin, wherein the pin is capable of being received within the slot of each end rail and rotated into locking position against an upper and lower surface of the slot of each end rail.

7. A board support frame as defined in claim 1, wherein each gripping channel further includes a lower portion and a pair of guide rails for assisting in retaining each guide element within the slot of each end rail.

8. An adjustable board support frame comprising:
   a pair of end rails, each end rail having a slot extending along a longitudinal axis thereof;
   a pair of gripping channels oriented in a substantially perpendicular direction with respect to said pair of end rails, each end of said pair of gripping channels including a guide element for slidably engaging the slot of each end rail to permit adjustment of said pair of gripping channels along the longitudinal axis of said end rails for engaging a board at a selected position along said end rails; and
   latch means received within said slot for locking said gripping channels at the selected position along the longitudinal axis of said end rails.

9. A board support frame as defined in claim 8 wherein said latch means comprises a locking tab having an oval-shaped pin, wherein the pin is capable of being received within the slot of each end rail and rotated into locking position against an upper and a lower surface of the slot of each end rail.

10. A board support frame as defined in claim 8 further comprising:
    a bottom support strip between said gripping channels slidably supported on each of said end rails.

11. A board support frame as defined in claim 10 wherein said bottom support strip includes a guide element capable of being received within said slot for selecting a position of said bottom support strip along said end rails.

12. A board support frame as defined in claim 8 wherein said gripping channels include a slot for slidably supporting the board.

13. A board support frame as defined in claim 8, wherein each gripping channel further includes a lower portion and a pair of guide rails for assisting in retaining each guide element within the slot of each end rail.

* * * * *